United States Patent
Takai

(10) Patent No.: US 7,839,191 B2
(45) Date of Patent: Nov. 23, 2010

(54) DLL CIRCUIT

(75) Inventor: Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/453,764

(22) Filed: May 21, 2009

(65) Prior Publication Data

US 2009/0289676 A1 Nov. 26, 2009

(30) Foreign Application Priority Data

May 22, 2008 (JP) .............................. 2008-134775

(51) Int. Cl.
*H03L 7/06* (2006.01)
(52) U.S. Cl. ...................... 327/158; 327/149
(58) Field of Classification Search .................. 327/149, 327/158
See application file for complete search history.

(56) References Cited

U.S. PATENT DOCUMENTS

| | | | |
|---|---|---|---|
| 6,876,239 B2 * | 4/2005 | Bell | 327/158 |
| 6,937,530 B2 * | 8/2005 | Bell | 365/189.02 |
| 6,956,418 B2 * | 10/2005 | Kwak et al. | 327/158 |
| 7,088,159 B2 * | 8/2006 | Kwak et al. | 327/161 |
| 7,161,397 B2 * | 1/2007 | Lee et al. | 327/149 |
| 7,202,719 B2 * | 4/2007 | Gabato et al. | 327/158 |
| 7,368,966 B2 * | 5/2008 | Hur | 327/175 |
| 7,388,415 B2 * | 6/2008 | Lee | 327/158 |
| 7,449,930 B2 * | 11/2008 | Hur | 327/158 |
| 7,548,100 B2 * | 6/2009 | Cho et al. | 327/175 |
| 7,605,626 B2 * | 10/2009 | Hur | 327/175 |
| 7,724,052 B2 * | 5/2010 | Hur | 327/158 |
| 7,737,744 B2 * | 6/2010 | Choi | 327/158 |
| 7,750,712 B2 * | 7/2010 | Ide et al. | 327/276 |
| 2003/0052718 A1 | 3/2003 | Takai | |

FOREIGN PATENT DOCUMENTS

JP          2003-091331 A          3/2003

* cited by examiner

*Primary Examiner*—Lincoln Donovan
*Assistant Examiner*—Adam D Houston
(74) *Attorney, Agent, or Firm*—Foley & Lardner LP

(57) ABSTRACT

A DLL circuit includes a coarse delay adjustment circuit and a fine delay adjustment circuit, which further includes a first fine delay circuit and a second fine delay circuit serving as an interpolation circuit. The coarse delay adjustment circuit delays a reference clock signal by a plurality of delay stages so as to provide the first fine delay circuit with two phase signals having the phase difference of two delay stages, which are then converted into two delay signals having the phase difference of one delay stage. The delay signals are subjected to interpolation, thus producing an output clock signal. Due to a reduction of the phase difference in the first fine delay circuit, it is possible to reduce the minimum operation cycle of the interpolation circuit and to thereby increase the maximum operation frequency of the DLL circuit.

11 Claims, 8 Drawing Sheets

DLL CIRCUIT

BACKGROUND OF THE INVENTION

1. Field of the Invention

The present invention relates to delay-clocked loop (DLL) circuits for synchronizing internal clock signals with external clock signals at leading/trailing edge timings.

The present application claims priority on Japanese Patent Application No. 2008-134775, the content of which is incorporated herein by reference.

2. Description of Related Art

Due to increasing high-speed processing of recent electronic systems, it is required for electronic systems to transfer data between semiconductor devices at a very high speed. For this reason, semiconductor devices such as synchronous dynamic random-access memory (SDRAM) adopt clock synchronization methods for synchronizing internal clock signals with external clock signals. SDRAM has been further developed in terms of data transfer by way of double data rate (DDR), DDR2, and DDR4, thus establishing clock synchronization at leading/trailing edges of clock signals.

Conventionally, various types of SDRAM have been designed to adopt delay-locked loop (DDL) circuits for establishing clock synchronization as disclosed in Patent Document 1, thus synchronizing timings between internal clock signals and external clock signals.

Patent Document 1: Japanese Unexamined Patent Application Publication No. 2003-91331

FIG. 5 shows an example of the DLL circuit using CMOS transistors as disclosed in Patent Document 1. The DLL circuit of FIG. 5 includes a coarse delay circuit 10 in which a plurality of delay elements 11 is connected together in a cascade-connection manner. The coarse delay circuit 10 is referred to as a coarse delay line, which delays a reference clock signal input thereto by a desired delay time so as to output a delay signal from a selected tap from among a plurality of taps having different delay times.

A multiplexer 12 is a switching unit for selecting one of odd-phase signals extracted from odd-numbered taps of the coarse delay circuit 10, while a multiplexer 13 is a switching unit for selecting one of even-phase signals extracted from even-numbered taps of the coarse delay circuit 10. A fine delay circuit 18 serves as an interpolation circuit receiving an odd-phase signal O0 and an even-phase signal E0 output from the multiplexers 12 and 13, thus producing an output clock signal. A phase detection circuit 21 detects a phase difference between the reference clock signal and the output clock signal of the fine delay circuit 18, thus outputting a phase detection result to a delay control circuit 22. Based on select signals output from the delay control circuit 22, the multiplexer 12 selects a desired odd-numbered tap of the coarse delay circuit 10, while the multiplexer 13 selects a desired even-numbered tap of the coarse delay circuit 10. In response to a control signal output from the delay control circuit 22, the fine delay circuit 18 changes an internal division on the phase difference between the reference clock signal and the output clock signal. FIG. 5 omits a generally-known constitution in which the output clock signal is supplied to a replica circuit, the output signal of which is then fed back to the phase detection circuit 21. By way of this constitution, the DLL circuit of FIG. 5 adjusts the phase of the reference clock signal in correspondence with a delay time adapted to the replica circuit.

FIG. 6 shows an example of the detailed constitution of the DLL circuit of FIG. 5, in which a plurality of coarse delay lines CDL 101 to 104 (corresponding to the coarse delay circuit 10) is connected to a plurality of multiplexers 205 to 208 (corresponding to the multiplexers 12 and 13) and a fine delay line FDL 210 (corresponding to the fine delay circuit 18).

In FIG. 6, a CDL 201 outputs a zero odd-phase signal $COUTO_0$ and a zero even-phase signal $COUTE_0$; then, subsequent to the CDL 201, a CDL 202 outputs a first odd-phase signal $COUTO_1$ and a first even-phase signal $COUTE_1$. Subsequent to the CDL 202, a CDL 203 outputs a second odd-phase signal $COUTO_2$ and a second even-phase signal $COUTE_2$; then, subsequent to the CDL 203, a CDL 204 outputs a third odd-phase signal $COUTO_3$ and a third even-phase signal $COUTE_3$. The zero to third odd-phase signals $COUTO_0$ to $COUTO_3$ are supplied to the multiplexer 205, in which one of them is selected in response to the select signal of the delay control circuit 22. The zero to third even-phase signals $COUTE_0$ to $COUTE_3$ are supplied to the multiplexer 206, in which one of them is selected in response to the select signal of the delay control circuit 22. The odd-phase signal selected by the multiplexer 205 is supplied to the multiplexer 207 so as to output a signal FINO, while the even-phase signal selected by the multiplexer 206 is supplied to the multiplexer 208 so as to output a signal FINE. The signals FINO and FINE are supplied to the interpolation circuit 210.

FIG. 7 shows a single coarse delay line (CDL) shown in FIG. 6, wherein CMOS gate circuits are used for inverters forming delay elements. Specifically, an inverter 211 for receiving an input signal $CDL_j$ is followed by seven pairs of inverters (i.e. seven inverter pairs corresponding to seven delay stages) 212-213, 214-215, 216-227, 218-219, 220-221, 222-223, and 224-225 and is finally connected with an inverter 226, thus outputting a signal $CDL_{j+1}$.

The output terminal of the inverter 211 receiving the input signal $CDL_j$ is connected to a tri-state inverter (or a clocked inverter) 311 whose output terminal is connected to the even-numbered inverter pairs (i.e. the inverter pairs consisting of 214-215, 218-219, and 222-223) via tri-state inverters 313, 315, and 317 and is finally connected to a buffer 227, the output terminal of which is connected to an odd-phase output terminal $COUTO_j$.

The output terminal of the inverter pair consisting of 212-213 is connected to a tri-state inverter 312 whose output terminal is connected to the odd-numbered inverter pairs (i.e. the inverter pairs consisting of 216-217, 220-221, and 224-225) via tri-state inverters 314, 316, and 318 and is finally connected to a buffer 228, the output terminal of which is connected to an even-phase output terminal $COUTE_j$.

In the above, two output signals whose delay times correspond to two inverter pairs are output from the output terminals $COUTO_j$ and $COUTE_j$.

The foregoing coarse delay circuit 10 generates two delay signals per every two inverter pairs (or every two delay stages), wherein the signals having delay times corresponding to two delay stages are output from the selected odd-numbered inverter pair and the selected even-numbered inverter pair. The two delay signals having different timings are subjected to interpolation in the fine delay circuit 18, thus achieving high-precision phase adjustment.

Since the two delay signals are output from the coarse delay circuit 10 with a delay difference corresponding to at least two inverter pairs therebetween, the fine delay circuit 18 needs to perform interpolation with respect to the delay difference corresponding to at least two inverter pairs.

That is, two signals E0 and O0 having the phase difference corresponding to the two inverter pairs therebetween are subjected to interpolation, thus producing an interpolation signal MIX0_T shown in FIG. 8. When the delay control circuit 22 determines a mixing factor of 100% with respect to the signal E0, the trailing edge of the interpolation signal MIX0_T depends upon the signal E0 only. When the delay control circuit 22 determines a mixing factor of 100% with respect to the signal O0, the trailing edge of the interpolation signal MIX0_T depends upon the signal D0 only. Thus, the trailing edge of the interpolation signal MIX0_T (i.e. the trailing-edge timing of the mixed signal MIXOUT) is determined based on the mixing factor between the signals E0 and D0. In this connection, the leading-edge timing of the mixed signal MIXOUT is determined by another interpolation circuit (for interpolating an inverse-phase signal).

In order to linearly interpolate the signals E0 and D0 having a phase difference 2tD therebetween (where tD denotes a delay time of each inverter pair), the interpolation signal MIX0_T needs a time of 2tD or more to be discharged from VDD to a threshold value VDD/2. In addition, another time of 2tD is necessary to cope with the phase difference between the signals E0 and D0, and a further time of 2tD is necessary for the interpolation signal MIX0_T to be decreased to VSS; hence, a total time of 6tD is required for the interpolation at the trailing edge of the interpolation signal MIX0_T. In order to achieve interpolation on both sides (i.e. both the leading edge and the trailing edge), the interpolation circuit requires a minimum operation cycle tCYC=12tD, which in turn regulates the maximum operation frequency of the DLL circuit. In order to increase the maximum operation frequency of the DLL circuit, it is necessary to decrease the minimum operation cycle tCYC of the interpolation circuit.

The present inventor has recognized that the foregoing DLL circuit performs interpolation on signals having the phase difference corresponding to at least the two inverter pairs (composed of CMOS gate circuits) therebetween, resulting in increasing the minimum operation cycle tCYC of the interpolation circuit and thus regulating the maximum operation frequency of the DLL circuit. The present inventor asserts that the minimum operation cycle tCYC of the interpolation circuit should be decreased in order to increase the maximum operation frequency of the DLL circuit.

SUMMARY

The invention seeks to solve the above problem, or to improve upon the problems at least in part.

In one embodiment, a DLL circuit is constituted of a first delay circuit (e.g. inverters 130 and 132) delaying a first signal (E0) or a second signal (D0) by a first delay time, thus producing a third signal (PHEO), and a second delay circuit (e.g. inverters 131 and 133) delaying the first signal or the second signal by a second delay time, thus producing a fourth signal (PHM), wherein the third signal differs from the fourth signal by a single delay stage.

In another embodiment, a DLL circuit is constituted of a coarse delay adjustment circuit which delays an input clock signal by way of a plurality of delay stages corresponding to different delay times so as to produce a first signal and a second signal having the phase difference of two delay stages therebetween, and a fine delay adjustment circuit which converts the first signal and the second signal into a third signal and a fourth signal having the phase difference of one delay stage therebetween. The third and fourth signals are subjected to interpolation, thus producing an output clock signal.

As described above, the first and second signals having the phase difference of two delay stages therebetween are converted into the third and fourth signals having the phase difference of one delay stage therebetween, which are interpolated by an interpolation circuit, thus producing the output clock signal. This reduces the minimum operation cycle of the interpolation circuit so as to remarkably increase the maximum operation frequency of the DLL circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
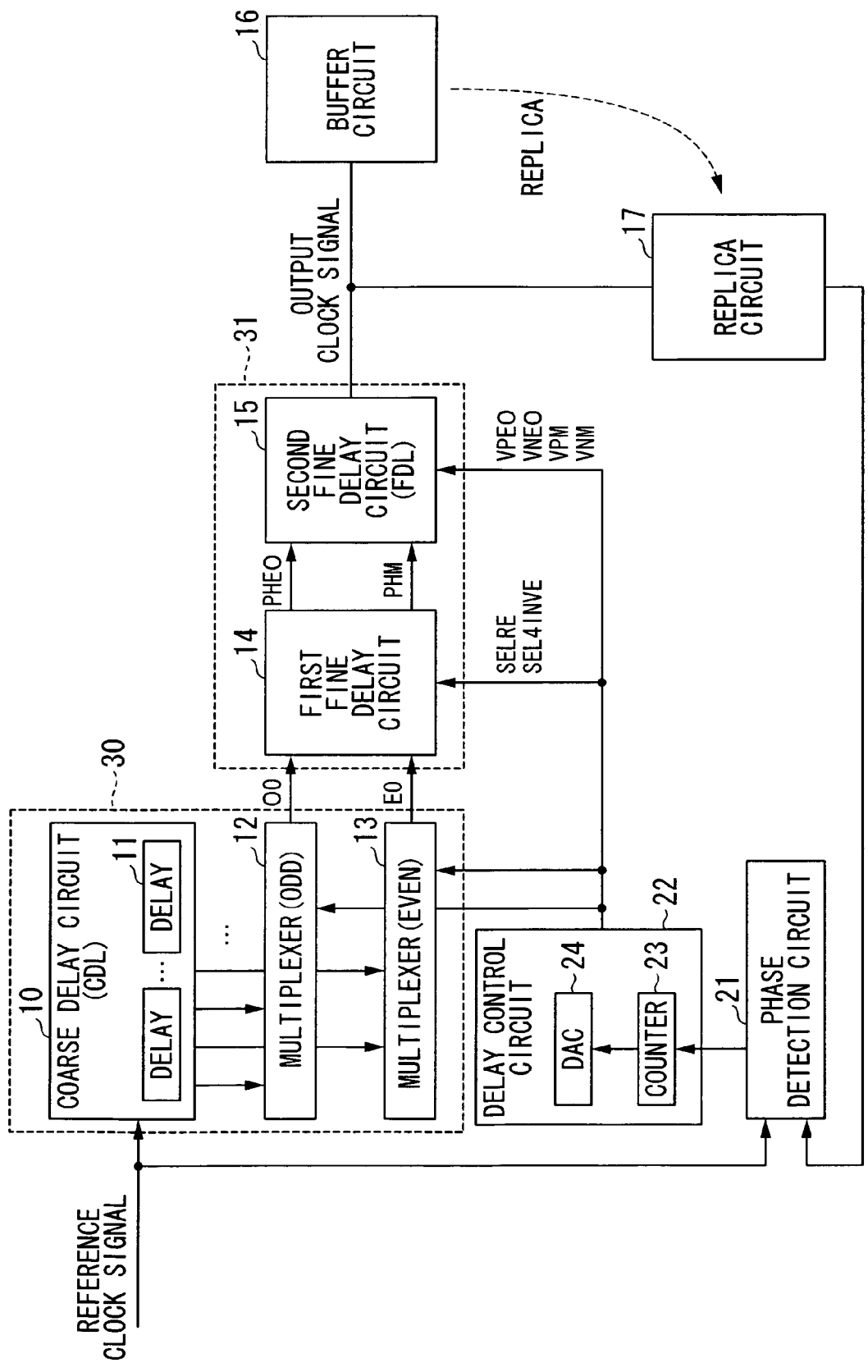
FIG. 1 is a block diagram showing the constitution of a DLL circuit according to a preferred embodiment of the present invention.
Figure 5:
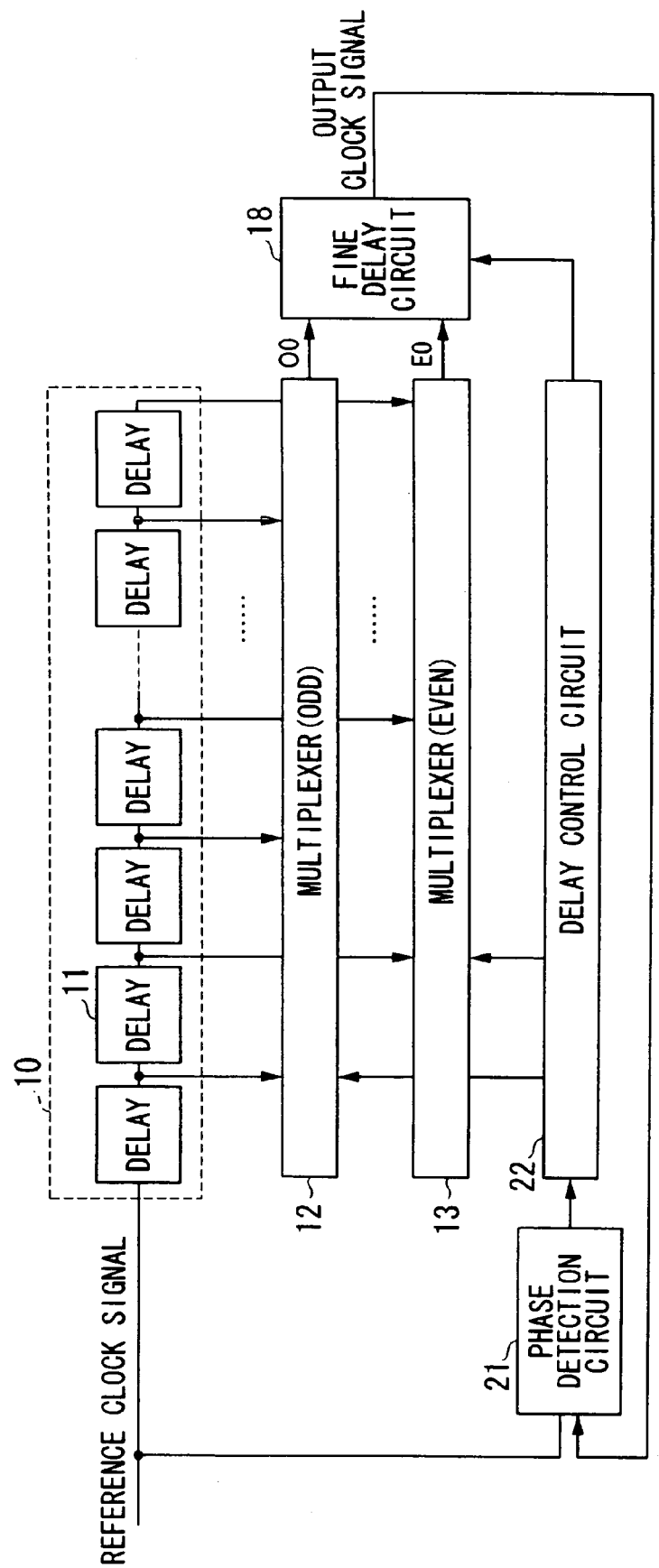
FIG. 5 is a block diagram showing the constitution of a DLL circuit.
Figure 6:
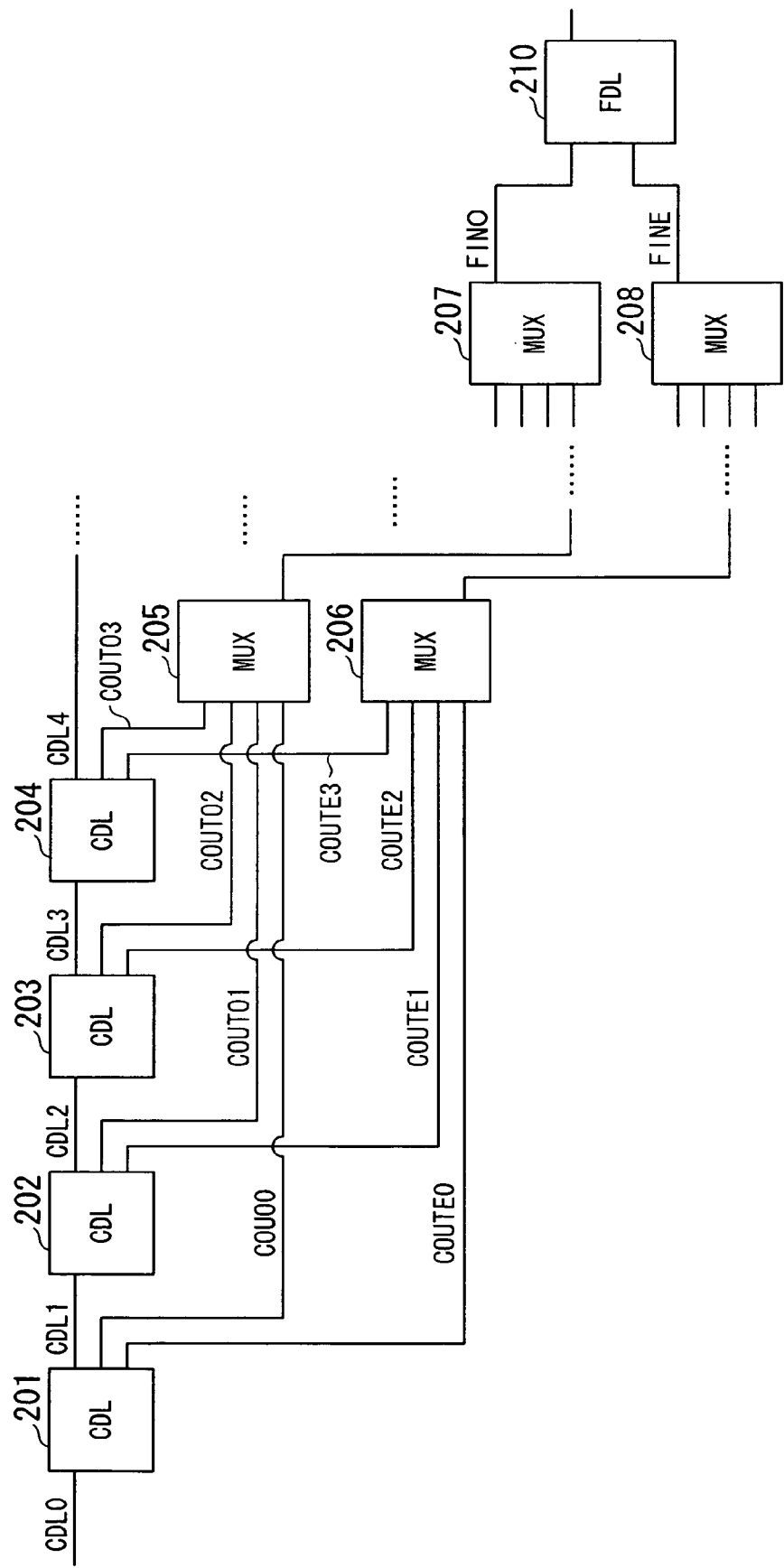
FIG. 6 is a block diagram showing the detailed constitution of the DLL circuit of FIG. 5.
Figure 7:
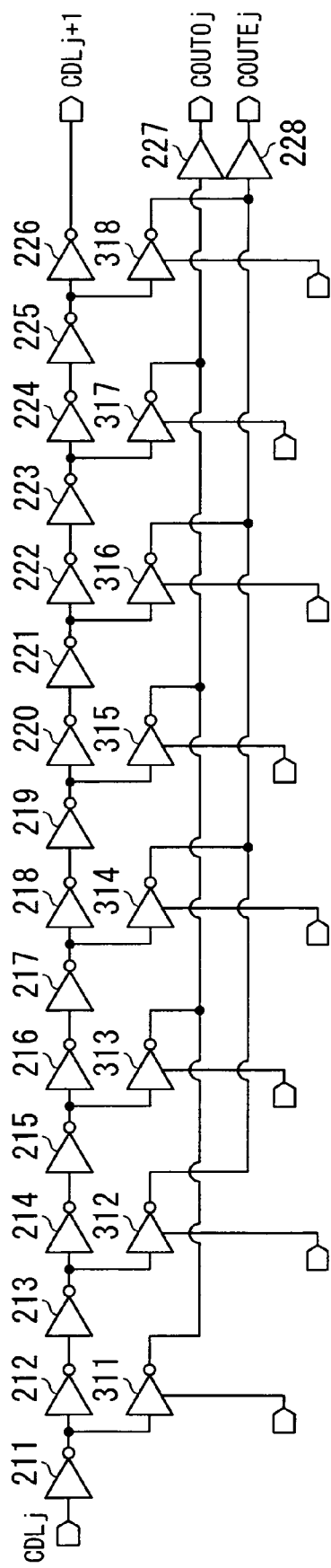
FIG. 7 is a circuit diagram showing the constitution of a single coarse delay line shown in FIG. 6.
Figure 8:
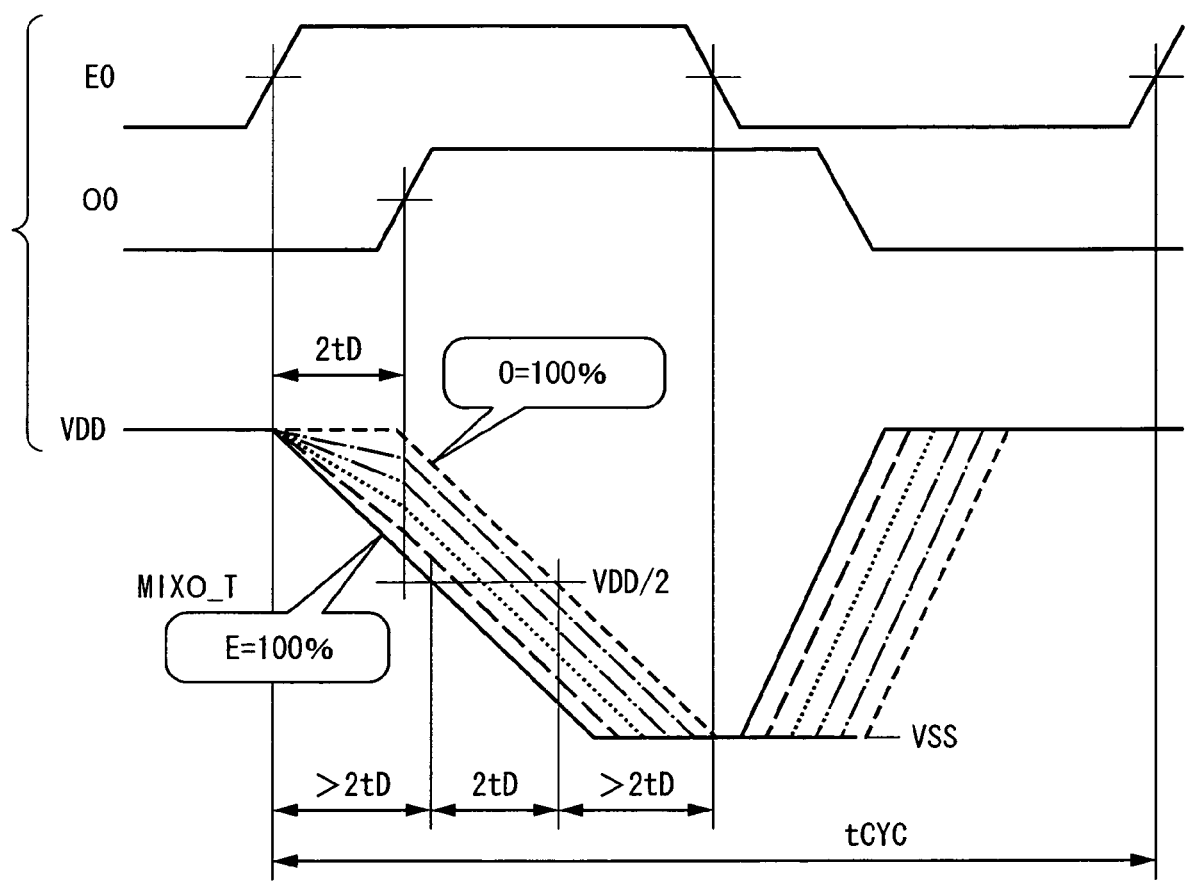
FIG. 8 shows the waveforms of signals used for explaining interpolation on two delay signals having the phase difference corresponding to two delay stages therebetween in the DLL circuit.

FIG. 1 is a block diagram showing a DLL circuit according to a preferred embodiment of the present invention, wherein parts identical to those shown in FIG. 5 are designated by the same reference numerals.

The DLL circuit of FIG. 1 includes a coarse delay adjustment circuit 30, a fine delay adjustment circuit 31, a buffer circuit 16, and a replica circuit 17 as well as the phase detection circuit 21 and the delay control circuit 22. The coarse delay adjustment circuit 30 includes the coarse delay circuit 10, and the multiplexers 12 and 13. The fine delay adjustment circuit 31 includes a first fine delay circuit 14 and a second fine delay circuit 15.

Similar to the DLL circuit of FIG. 5, the DLL circuit of FIG. 1 includes the coarse delay circuit 10, the multiplexers 12 and 13, and the phase detection circuit 21. The delay control circuit 22 of FIG. 1 differs from the delay control circuit 22 in that it produces control signals SELRE and SEL4INVE for the first fine delay circuit 14 as well as control voltages VPEO, VNEO, VPM, and VNM for the second fine delay circuit 15.

In the DLL circuit of FIG. 1, the coarse delay circuit 10 includes a plurality of delay elements 11 which are connected together in a cascade-connection manner and is referred to as a coarse delay line having a plurality of taps having different delay times, so that the reference clock signal input thereto is delayed by a desired delay time and is extracted from a selected tap.

The multiplexer 12 is a switching unit for selecting one of odd-phase signals extracted from the odd-numbered taps of the coarse delay circuit 10, thus outputting a selected odd-phase signal O0. The multiplexer 13 is a switching unit for selecting one of even-phase signals extracted from the even-numbered taps of the coarse delay circuit 10, thus outputting a selected even-phase signal E0.

The odd-phase signal O0 and the even-phase signal E0 output from the multiplexers 12 and 13 are supplied to the first fine delay circuit 14, which in turn outputs delay signals PHEO and PHM to the second fine delay circuit 15 (i.e. a fine delay line) serving as an interpolation circuit.

The replica circuit 17 is a replica of the buffer circuit 16 for outputting a DQ signal, in other words, the replica circuit 17 is a buffer circuit having the same process-voltage-temperature dependency (i.e. PVT dependency) as the buffer circuit 16.

The phase detection circuit 21 detects a phase difference between the reference clock signal and the replica output signal of the replica circuit 17, thus outputting the detection result thereof to the delay control circuit 22.

The delay control circuit 22 determines a delay time based on the detection result of the phase detection circuit 21, thus producing and outputting select signals to the multiplexers 12 and 13. In addition, the delay control circuit 22 produces the control signals SELRE and SEL4INVE for controlling the first fine delay circuit 14 as well as the control voltages VPEO, VNEO, VPM, and VNM for controlling the second fine delay circuit 15.

The delay control circuit 22 includes a counter 23 which counts up/down based on the detection result of the phase detection circuit 21 and a digital-to-analog converter (DAC) 24 for converting the count value of the counter 23 into an analog value. The DAC 24 outputs the control voltages VPEO, VNEO, VPM, and VNM to the second fine delay circuit 15.

Figure 2:
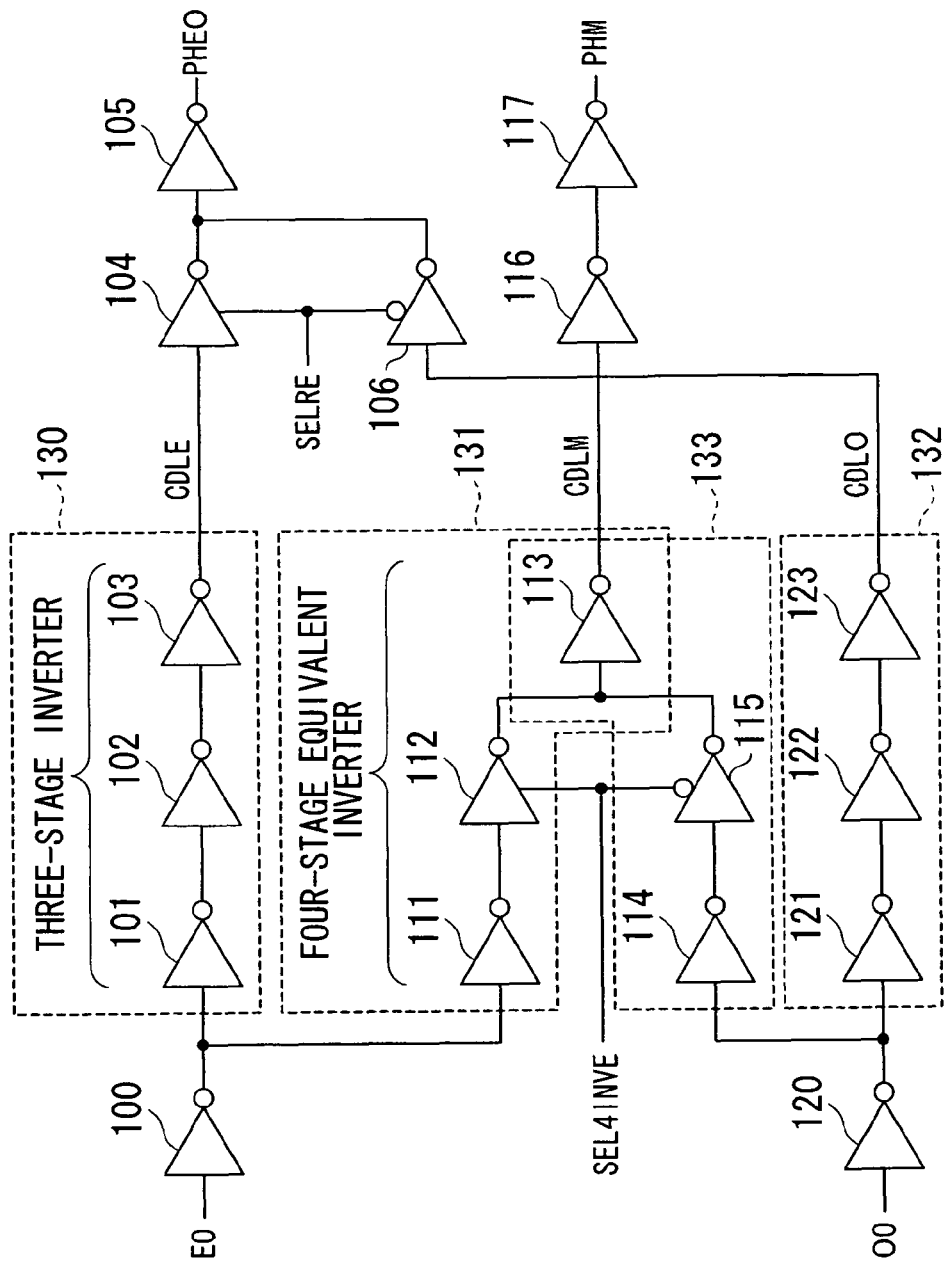
FIG. 2 is a circuit diagram showing the detailed constitution of a first fine delay circuit included in the DLL circuit of FIG. 1.

FIG. 2 shows the detailed constitution of the first fine delay circuit 14 included in the fine delay adjustment circuit 31 of the DLL circuit of FIG. 1. The first fine delay circuit 14 produces the delay signals PHEO and PHEM having the phase difference of one delay stage therebetween based on the odd-phase signal O0 and the even-phase signal E0 having the phase difference of two delay stages therebetween output from the coarse delay circuit 10 via the multiplexers 12 and 13.

In the first fine delay circuit 14 of FIG. 2, the even-phase signal E0 is supplied to an inverter 100, while the odd-phase signal O0 is supplied to an inverter 120.

The even-phase signal E0 is inverted by the inverter 100 and is then supplied to a delay unit 130 having a three-stage inverter which is composed of three inverters 101, 102, and 103 so as to achieve three delay stages, and another delay unit 131 having a four-stage equivalent inverter which is composed of three inverters 11, 112, and 113 so as to equivalently emulate four delay stages.

The odd-phase signal O0 is inverted by the inverter 120 and is then supplied to a delay unit 132 having a three-stage inverter which is composed of three inverters 121, 122, and 123 so as to achieve three delay stages, and another delay unit 133 having a four-stage equivalent inverter which is composed of the inverter 113, and inverters 114 and 115 so as to equivalently emulate four delay stages.

The inverters 112 and 115 are each configured of a tri-state inverter, wherein the first one of the signals E0 and D0 is selected by the control signal SEL4INVE from the delay control circuit 22 and is then transmitted to the second fine delay circuit 15 via the inverters 113, 116, and 117 as the delay signal PHM.

The even-phase signal E0 is transmitted through the inverter 100 and the three-stage inverter consisting of 101, 102, and 103 and is thus converted into a signal CDLE, which is then supplied to a tri-stage inverter 104. The odd-phase signal D0 is transmitted through the inverter 120 and the three-stage inverter consisting of 121, 122, and 123 and is thus converted into a signal DDLO, which is then supplied to a tri-stage inverter 106.

Both the tri-state inverters 104 and 106 share the control terminal for receiving the control signal SELRE from the delay control circuit 22. In addition, both the output terminals of the tri-state inverters 104 and 106 are connected to the input terminal of an inverter 105. This constitution allows one of the signals E0 and D0 to be selected in response to the control signal SELRE, thus outputting the delay signal PHEO to the second fine delay circuit 15.

As shown in FIG. 2, the first fine delay circuit 14 is not necessarily formed using the combination of the three-stage inverter (e.g. 130 consisting of 101, 102, and 103) and the four-stage equivalent inverter (e.g. 131 consisting of 111, 112, and 113), which can be replaced with the combination of the two-stage inverter (including two inverters) and the three-stage equivalent inverter (including two inverters equivalently emulating three inverters) or the combination of the four-stage inverter (including four inverters) and the five-stage equivalent inverter (including four inverters equivalently emulating five inverters). Normally, it is possible to use the combination of the n-stage inverter (including n inverters, where $n \geq 2$) and the (n+1)-stage equivalent inverter (including n inverters equivalently emulating n+1 inverters). In this connection, inverters can be replaced with CMOS gate circuits, NAND circuits, and the like.

Each of the delay times of the delay units 131 and 133 can be adjusted to achieve four delay stages by adjusting the gate lengths and widths of MOS transistors forming the inverters 111 to 115.

Figure 3A:
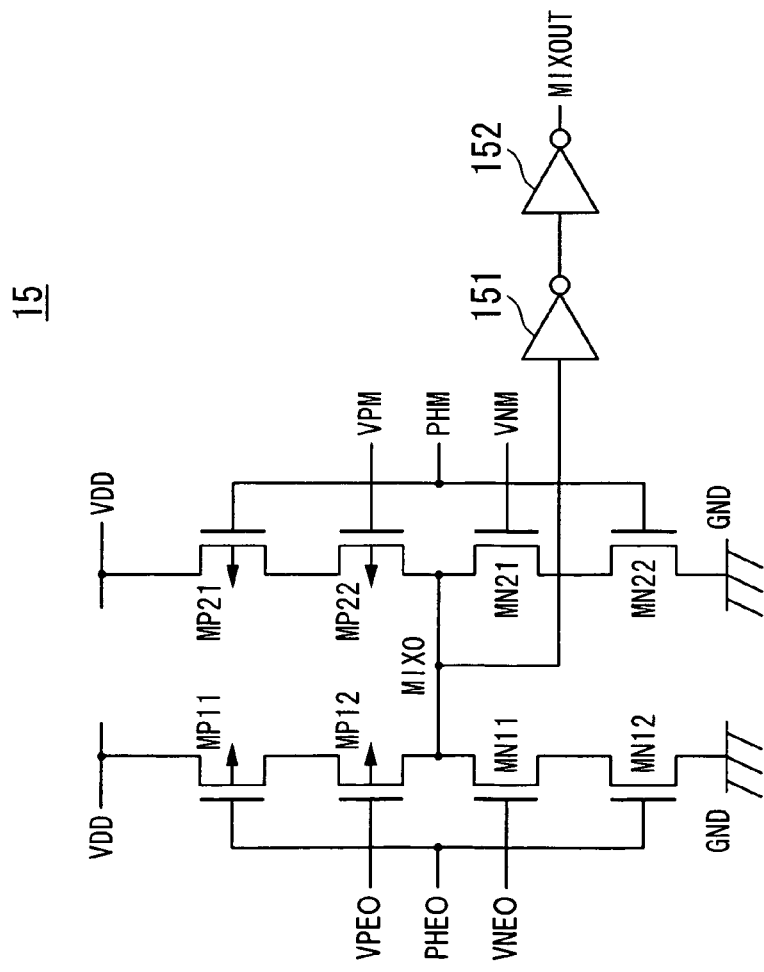
FIG. 3A is a circuit diagram showing the detailed constitution of a second fine delay circuit serving as an interpolation circuit in the DLL circuit of FIG. 1.

FIG. 3A shows the detailed constitution of the second fine delay circuit serving as the interpolation circuit. The interpolation circuit of FIG. 3 includes two clocked inverters, wherein a first clocked inverter is constituted of P-channel MOS transistors (referred to as PMOS transistors) MP11 and MP12, and N-channel MOS transistors (referred to as NMOS transistors) MN11 and MN12 which are connected in series, while second clocked inverter is constituted of PMOS transistors MP21 and MP22 and NMOS transistors MN21 and MN22 which are connected in series.

In the first clocked inverter, the source of the PMOS transistor MP11 is connected to a power-supply voltage VDD, while the source of the NMOS transistor MN12 is connected to a ground potential GND. The gates of the PMOS transistor MP11 and the NMOS transistor NM 12 are connected together so as to receive the delay signal PHEO which is produced by the first fine delay circuit 14 based on either the even-phase signal E0 or the odd-phase signal O0. The gate of the PMOS transistor MP12 receives the control voltage VPEO from the delay control circuit 22, while the gate of the NMOS transistor MN11 receives the control voltage VNEO from the delay control circuit 22.

In the second clocked inverter, the source of the PMOS transistor MP21 is connected to the power-supply voltage VDD, while the source of the NMOS transistor MN22 is connected to the ground potential GND. The gates of the PMOS transistor MP21 and the NMOS transistor MN22 are connected together to receive the delay signal PHM which is produced by the first fine delay circuit 14 based on the first one of the signals E0 and D0. The gate of the PMOS transistor MP22 receives the control voltage VPM from the delay control circuit 22, while the gate of the NMOS transistor MN21 receives the control voltage VMN from the delay control circuit 22.

The output terminal of the first clocked inverter (i.e. the connection point between the drains of the transistors MP12 and MN11) is connected to the output terminal of the second clocked inverter (i.e. the connection point between the drains of the transistors MP22 and MN21) at an interpolation node MIXO, from which an output signal MIXOUT is output via inverters 151 and 152. As described above, the interpolation circuit can be formed using two clocked inverters with ease.

Based on the control voltages VPEO, VNEO, VPM, and VMN produced by the counter 23 and the DAC 24 of the delay control circuit 22 based on the detection result of the phase detection circuit 21, the leading-edge and trailing-edge waveforms at the interpolation node MIXO are controlled so as to determine the timing of the output signal MIXOUT.

Figure 3B:
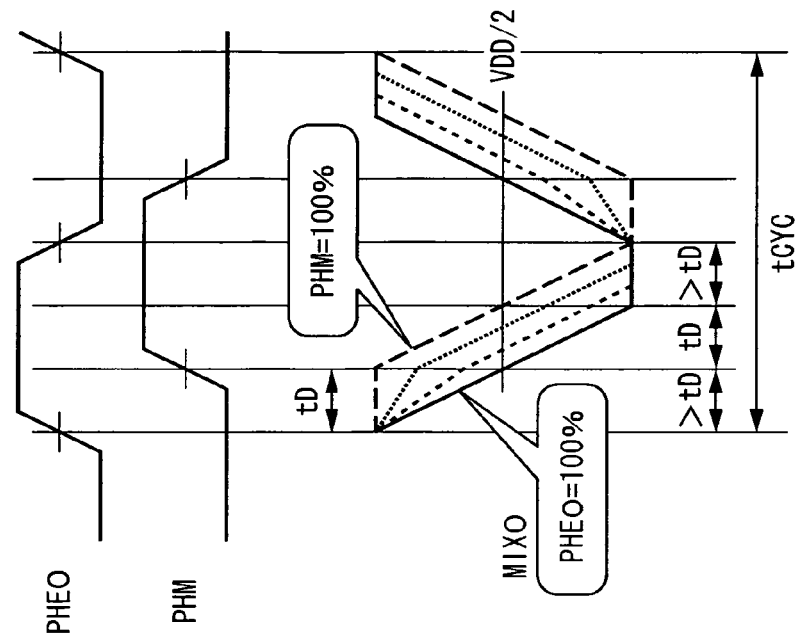
FIG. 3B is a graph showing the waveforms of signals used for explaining the interpolation operation.

As shown in FIG. 3B, the trailing-edge waveform at the interpolation node MIXO depends upon only the delay signal PHEO when the delay control circuit 22 assigns a mixing factor of 100% to the delay signal PHEO by decreasing the control voltage VPEO to a low level while increasing the control voltage VNEO to a high level. In addition, the trailing-edge waveform at the interpolation node MIXO depends upon only the delay signal PHM when the delay control circuit 22 assigns a mixing factor of 100% to the delay signal PHM by decreasing the control voltage VPM to a low level while increasing the control voltage VNM to a high level. That is, the trailing-edge waveform at the interpolation terminal MIXO, i.e. the trailing-edge timing of the output signal MIXOUT, depends upon the mixing factor assigned to the delay signals PHEO and PHM.

In order to maximize the effect of the DLL circuit, the same control signals are used for adjusting both the leading-edge and trailing-edge waveforms. The present embodiment can be modified by additionally inserting a duty control circuit (not shown) prior to the coarse delay circuit 10, wherein the reference clock signal having a corrected duty ratio is supplied to the coarse delay circuit 10, the first fine delay circuit 14, and the second fine delay circuit 15.

Next, the operation of the first fine delay circuit 14 for converting the signals O0 and E0 having the phase difference of two delay stages therebetween into the signals PHEO and PHM having the phase difference of one delay stage therebetween will be described with reference to FIG. 2 and Table 1 showing the relationship between the signals and the numbers of delay stages as well as high/low levels (H/L).

TABLE 1

| E0      | 0 | 0 | 4 | 4 | 4  |
|---------|---|---|---|---|----|
| O0      | 2 | 2 | 2 | 2 | 6  |
| SEL4INVE| H | H | L | L | H  |
| CDLE    | 4 | 4 | 8 | 8 | 8  |
| CDLM    | 5 | 5 | 7 | 7 | 9  |
| CDLO    | 6 | 6 | 6 | 6 | 10 |

TABLE 1-continued

| SELRE | H | L | L | H  | H  |
|-------|---|---|---|----|----|
| PHEO  | 6 | 8 | 8 | 10 | 10 |
| PHM   | 7 | 7 | 9 | 9  | 11 |

A first column of Table 1 shows that due to the coarse delay circuit 10 selecting a tap having the minimum delay time (referred to as a zero-stage tap), the even-phase signal E0 is extracted from the zero-stage tap prior to the odd-phase signal D0 extracted from a second-stage tap which is delayed from the zero-stage tap by two delay stages.

In the above, the control signal SELFE output from the delay control circuit 22 turns to a high level so that the first fine delay circuit 14 produces the signal CDLE based on the even-phase signal E0, thus outputting the delay signal PHEO having six delay stages via the six inverters 100, 101, 102, 103, 104, and 105. In addition, the control signal SEL4INVE output from the delay control circuit 22 turns to a high level so that the first fine delay circuit 14 produces the signal CDLM based on the even-phase signal E0, wherein the signal E0 is delayed by the five inverters (i.e. the inverter 100 and the four-stage equivalent inverters consisting of 111-113 and is thus converted into the signal CDLM, which is further delayed by the two inverters 116 and 117 and is thus converted into the delay signal PHM having seven delay stages in total. That is, the signals E0 and D0 having the phase difference of two delay stages therebetween are converted into the signals PHEO and PHM having the phase difference of one delay stage therebetween, which are then subjected to interpolation by the second fine delay circuit 15.

Figures 4A, 4B, 4C:
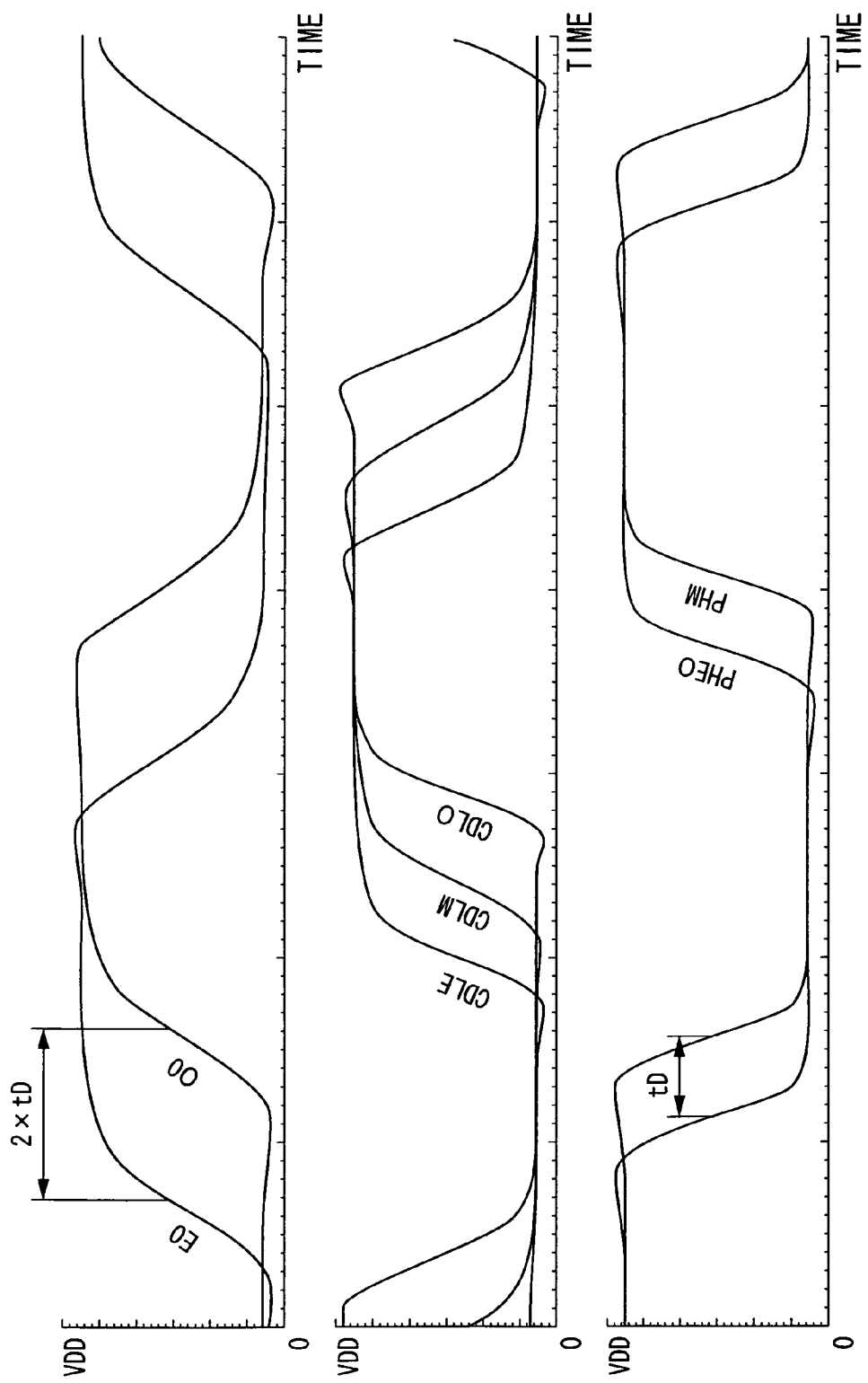
FIG. 4A is a graph showing the waveforms of signals E0 and D0 having the phase difference of two delay stages therebetween.
FIG. 4B is a graph showing the waveforms of signals CDLE, CDLM, and CDLO based on the signals E0 and D0.
FIG. 4C is a graph showing the waveforms of signals PHEO and PHM having the phase difference of one delay stage therebetween based on the signals CDLE, CDLM, and CDLO.

The above operation will be described in detail with reference to FIGS. 4A to 4C, which show simulation waveforms produced by the first fine delay circuit 14. FIG. 4A shows the waveforms of the signals E0 and D0 having the phase difference of two delay stages (i.e. 2×tD) therebetween extracted from the coarse delay circuit 10. The first fine delay circuit 14 produces the signals CDLE, CDLM, and CDLO having the waveforms shown in FIG. 4B based on the signals E0 and D0. Then, it produces the signals PHEO and PHM having the waveforms shown in FIG. 4B. The signals PHEO and PHM having the phase difference of one delay stage (i.e. 1×tD) therebetween are supplied to the second fine delay circuit 15 serving as the interpolation circuit.

As shown in FIG. 3B, the second fine delay circuit 15 performs interpolation on the phase difference of one delay stage ranging from PHEO (whose mixing factor is 100%) to PHM (whose mixing factor is 100%).

When the mixing factor of 100% is assigned to the signal PHM so as to increase the delay time, the signal PHEO is produced based on the signal D0, wherein the signal D0 is delayed by eight delay stages in total because the signal D0 is already delayed by two delay stages compared to the signal E0 which is delayed by six delay stages in the first fine delay circuit 14. Since the signal PHM still has seven delay stages, the phase difference between the signals PHEO and PHM is equal to 8−7=1, i.e. one stage delay as shown in a second column of Table 1.

When the mixing factor of 100% is assigned to the signal D0, the signal E0 is switched over and extracted from a fourth-stage tap of the coarse delay circuit 10 while the signal D0 is still extracted from the second-stage tap. In this case, the phase difference between the signals PHEO and PHM is equal to 9−8=1, i.e. one delay stage as shown in a third column of Table 1. Similarly, when the coarse delay circuit 10 is controlled to increase the delay time, the second fine delay circuit 15 interpolates between the signals PHEO and PHM normally having the phase difference of one delay stage therebetween.

Compared to the foregoing fine delay circuit 18 for interpolating between the signals D0 and E0 normally having the phase difference of two delay stages therebetween, the second fine delay circuit 15 serving as the interpolation circuit interpolates between the signals PHEO and PHM normally having the phase difference of one delay stage (i.e. 1tD); hence, it needs a time of 1tD or more to discharge the interpolation node to the threshold value of VDD/2. In addition, it needs another time of 1tD to decrease the interpolation node to the ground potential VSS in addition to the delay time of 1tD between the signals PHEO and PHM. That is, the present embodiment needs 3tD with respect to the leading-edge waveform at the interpolation node, in other words, the interpolation circuit needs the minimum cycle tCYC of 6tD in total with respect to both the leading-edge and trailing-edge waveforms at the interpolation node. Thus, the DLL circuit of the present invention is capable of reducing the minimum cycle tCYC to a half the foregoing value of 12tD, thus remarkably increasing the maximum operation frequency thereof.

The first fine delay circuit 14 for converting two delay stages into one delay stage is not designed to independently control the leading-edge waveform and the trailing-edge waveform because it is possible to simplify the constitution and operation of the interpolation circuit in association with a single array of delay elements 11 included in the coarse delay circuit 10. In addition, the interpolation circuit is designed to maintain a certain pulse width irrespective of the interpolation factor by assigning the same interpolation factor to both the leading-edge waveform and the trailing-edge waveform, thus maintaining a certain high-level period and a certain low-level period with respect to the output clock signal. This makes it possible to minimize the minimum operation cycle (corresponding to the sum of the high-level period and the low-level period), thus increasing the maximum operation frequency of the DLL circuit.

It is effective to introduce a duty adjustment circuit (not shown) for adjusting the duty ratio of the reference clock signal to 50% prior to the coarse delay circuit 10, thus maintaining a certain high-level period and a certain low-level period with respect to an input signal of the interpolation circuit.

The first fine delay circuit 14 is formed using the four-stage equivalent inverter consisting of three inverters, whereas it is possible to use the combination of two buffers for achieving three delay stages in order to minimize the latency. Alternatively, it is possible to use the combination of four buffers achieving five delay stages which is improved in fineness to minimize the partial distortion of the waveform occurring due to the minimization of the operation cycle.

As described above, the DLL circuit of the present embodiment is designed such that the first fine delay circuit 14 reduces the phase difference of two delay stages to the phase difference of one delay stage so as to reduce the minimum operation cycle of the second fine delay circuit 15 (serving as the interpolation circuit) to a half, thus remarkably increasing the maximum operation frequency of the DLL circuit.

In the claim language, the even-phase signal E0 is referred to as a first signal; the odd-phase signal O0 is referred to as a second signal; the delay signal PHEO is referred to as a third signal; and the delay signal PHM is referred to as a fourth signal. In addition, the control signals SELRE and SEL4INV output from the delay control circuit 22 is collectively referred to as a first control signal, while the control voltages VPEO, VNEO, VPM, and VNM are collectively referred to as a second control signal. Furthermore, the three-stage inverters 130 and 131 included in the first fine delay circuit 14 are collectively referred to as a first delay circuit, while the four-stage equivalent inverters 131 and 133 are collectively referred to as a second delay circuit.

Lastly, it is apparent that the present invention is not limited to the above embodiments, but may be modified and changed without departing from the scope and spirit of the invention.

What is claimed is:

1. A DLL circuit comprising:
a first delay circuit delaying a first signal by a first delay time, thus producing a third signal; and
a second delay circuit delaying the first signal by a second delay time, thus producing a fourth signal,
wherein the third signal differs from the fourth signal by a single delay stage.

2. The DLL circuit according to claim 1, wherein both the first delay circuit and the second delay circuit include a same number of delay elements.

3. The DLL circuit according to claim 2, wherein each of the delay elements includes a plurality of MOS transistors, and wherein a gate length of the MOS transistor included in the first delay circuit differs from a gate length of the MOS transistor included in the second delay circuit.

4. The DLL circuit according to claim 2, wherein each of the delay elements includes a plurality of MOS transistors, and wherein a gate width of the MOS transistor included in the first delay circuit differs from a gate width of the MOS transistor included in the second delay circuit.

5. The DLL circuit according to claim 1, wherein the first delay circuit receiving a second signal delays the first signal or the second signal by the first delay time so as to produce the third signal, and wherein the second delay circuit receiving the second signal delays the first signal or the second signal by the second delay time so as to produce the fourth signal.

6. The DLL circuit according to claim 5, wherein the first signal and the second signal is switched over in response to a first control signal supplied each of the first delay circuit and the second delay circuit so that the third signal and the fourth signals are produced based on either the first signal or the second signal selectively.

7. A circuit comprising:
a first delay circuit that delays a local clock so as to generate a first delayed clock signal, wherein the first delay circuit includes a plurality of first delay elements; and
a second delay circuit that delays the local clock so as to generate a second delayed clock signal, wherein the second delay circuit includes a plurality of second delay elements, the number of which is equal to the number of the first delay elements,
wherein a difference between the first delayed clock signal and the second delayed clock signal is substantially equal to a delay time corresponding to a stage of the first delay elements.

8. The circuit according to claim 7 further comprising a fine delay circuit and a delay control circuit, wherein the fine delay circuit receiving the first delayed clock signal and the second delayed clock signal generates an internal clock signal by use of the first delayed clock signal and the second delayed clock signal, and wherein the delay control circuit controls the fine delay circuit so as to synchronize the internal clock signal with a reference clock signal.

9. The circuit according to claim 7, wherein the first delay element includes at least one first MOS transistor, and wherein the second delay element includes at least one second MOS transistor.

10. The circuit according to claim 9, wherein the first MOS transistor differs from the second MOS transistor in terms of a gate length.

11. The circuit according to claim 9, wherein the first MOS transistor differs from the second MOS transistor in terms of a gate width.

* * * * *